United States Patent [19]

Pascucci et al.

[11] Patent Number: 5,541,884
[45] Date of Patent: Jul. 30, 1996

[54] METHOD AND CIRCUIT FOR SUPPRESSING DATA LOADING NOISE IN NONVOLATILE MEMORIES

[75] Inventors: Luigi Pascucci; Carla M. Golla, both of Sesto San Giovanni; Marco Maccarrone, Palestro; Marco Olivo, Bergamo, all of Italy

[73] Assignee: SGS-Thomson Microelectronics S.r.l., Italy

[21] Appl. No.: 391,147

[22] Filed: Feb. 21, 1995

[30] Foreign Application Priority Data

Feb. 18, 1994 [EP] European Pat. Off. ............ 94830073

[51] Int. Cl.⁶ .................................................. G11C 7/00
[52] U.S. Cl. ..................... 365/206; 365/159.05; 365/194
[58] Field of Search .............................. 365/206, 189.05, 365/194, 227

[56] References Cited

U.S. PATENT DOCUMENTS

| | | | |
|---|---|---|---|
| 4,339,809 | 7/1982 | Stewart | 365/206 |
| 4,827,454 | 5/1989 | Okazaki | 365/233.5 |
| 4,943,949 | 7/1990 | Yamaguchi et al. | 365/206 |
| 5,272,674 | 12/1993 | Pathak et al. | 365/206 |
| 5,341,338 | 8/1994 | Hashiguchi et al. | 365/206 |

FOREIGN PATENT DOCUMENTS

| | | | |
|---|---|---|---|
| 0322901 | 7/1989 | European Pat. Off. | G11C 7/00 |
| 0560623 | 9/1993 | European Pat. Off. | G11C 7/00 |

*Primary Examiner*—David C. Nelms
*Assistant Examiner*—Son Dinh
*Attorney, Agent, or Firm*—David V. Carlson; Bryan A. Santarelli; Seed and Berry

[57] ABSTRACT

In a nonvolatile memory comprising a data amplifying unit and an output element mutually connected by a connection line, the noise suppressing circuit comprises a network for generating a noise suppressing signal which is synchronized substantially perfectly with a signal controlling data loading from the amplifying unit to the output unit, presents a very short duration, equal to the switching time of the output unit, and freezes the amplifying unit during switching of the output unit to prevent this from altering the data stored in the amplifying unit or internal circuits of the memory. The same signal also blocks an address amplifying unit on the address bus.

12 Claims, 5 Drawing Sheets

METHOD AND CIRCUIT FOR SUPPRESSING DATA LOADING NOISE IN NONVOLATILE MEMORIES

CROSS-REFERENCE TO RELATED APPLICATIONS

The present application claims priority from European Patent Application No 94830073.6, filed Feb. 18, 1994, and incorporated herein by reference. The present application is related to pending U.S. patent application entitled "METHOD AND CIRCUIT FOR TIMING THE LOADING OF NONVOLATILE-MEMORY OUTPUT DATA", by Luigi Pascucci, Marco Maccarrone and Marco Olivo, and filed on Feb. 21, 1995, which claims priority from European Patent Application No. 94830069.4, filed on Feb. 18, 1994; U.S. patent application entitled "INTERNAL TIMING METHOD AND CIRCUIT FOR PROGRAMMABLE MEMORIES", by Luigi Pascucci, Marco Olivo and Carla Maria Golla, and filed on Feb. 21, 1995, which claims priority from European Patent Application No. 94830070.2, filed on Feb. 18, 1994; U.S. patent application entitled "LOAD SIGNAL GENERATING METHOD AND CIRCUIT FOR NONVOLATILE MEMORIES", by Luigi Pascucci and Carla Maria Golla, and filed on Feb. 21, 1995, which claims priority from European Patent Application No. 94830071.0, filed on Feb. 18, 1994; U.S. patent application entitled "PROGRAMMABLE LOGIC ARRAY STRUCTURE FOR SEMICONDUCTOR NONVOLATILE MEMORIES, PARTICULARLY FLASH-EEPROMs", by Silvia Padoan and Luigi Pascucci, and filed on Feb. 21, 1995, which claims priority from European Patent Application No. 94830072.8, filed on Feb. 18, 1994; U.S. patent application entitled "METHOD AND CIRCUIT FOR TIMING THE READING OF NONVOLATILE MEMORIES", by Luigi Pascucci, Silvia Padoan, Carla Maria Golla, Marco Maccarrone and Marco Olivo, and filed on Feb. 21, 1995, which claims priority from European Patent Application No. 94830074.4, filed on Feb. 18, 1994, all of which are incorporated herein by reference.

TECHNICAL FIELD

The present invention relates to a method and circuit for suppressing the data loading noise in nonvolatile memories.

BACKGROUND OF THE INVENTION

As is known, increasing demand exists for memories characterized by flexibility, low power consumption and immunity to noise. These characteristics are extremely difficult to achieve simultaneously, because in known devices, each can only be obtained at the expense of the others. As such, a trade-off is inevitable, bearing in mind the effect in terms of technological yield, and the impossibility of achieving an all-around solution suitable for all applications.

A timer, for example, is useful in reducing power consumption but, being invariably rigid, responds poorly to certain inevitable technological changes that are better catered to by a static-type architecture.

Moreover, a timed architecture, though it provides for solving certain noise, dissipation and speed problems, is limited in situations where certain lines are slowly brought up to the steady-state condition.

Bearing in mind these and many other factors (e.g. slow memory locations, shifts in component characteristics, and localized nonuniform behavior), a timer has been proposed for regulating the duration of the load pulse according to the characteristics of the memory. This architecture provides for exploiting the advantages of the timed approach (low consumption, speed) while at the same time recovering slower devices, or devices with nontypical parameters or involving frequent resetting of lines which are slow to reach the correct steady-state level.

On the other hand, to obtain a good degree of immunity to noise when loading data into the output circuits requires the generation of load pulses of as short a duration as possible. One way of doing this is by maintaining the output circuits disconnected from the internal memory circuits, and only permitting a very brief connection when actually loading the data. Noise immunity as described above, however, depends entirely on the load pulse being very short, and is lost or at any rate considerably reduced in the event the duration of the load pulses is extended for recovering slower devices and situations.

SUMMARY OF THE INVENTION

It is an object of the present invention to provide a timer which, on the one hand, provides for achieving a good degree of immunity to noise, and, on the other, also permits the use of devices which are slower intrinsically or at least in certain operating conditions.

In practice, according to the invention, the duration of the load pulse is modulated as required by the memory, and the outputs of the output and address buffers are frozen for a brief instant by means of a pulse enabled substantially simultaneous or simultaneously with the load pulse, so that most of the output circuits and addresses switch without altering the data stored in the buffers, and the data relative to slower locations or situations (which, involving switching of far fewer elements, is typically not such as to generate noticeable noise) may then also be transmitted and acquired.

BRIEF DESCRIPTION OF THE DRAWINGS

A non-limiting embodiment of the present invention is described by way of example with reference to the accompanying drawings, in which.

DETAILED DESCRIPTION OF THE PREFERRED EMBODIMENT

Figure 1:
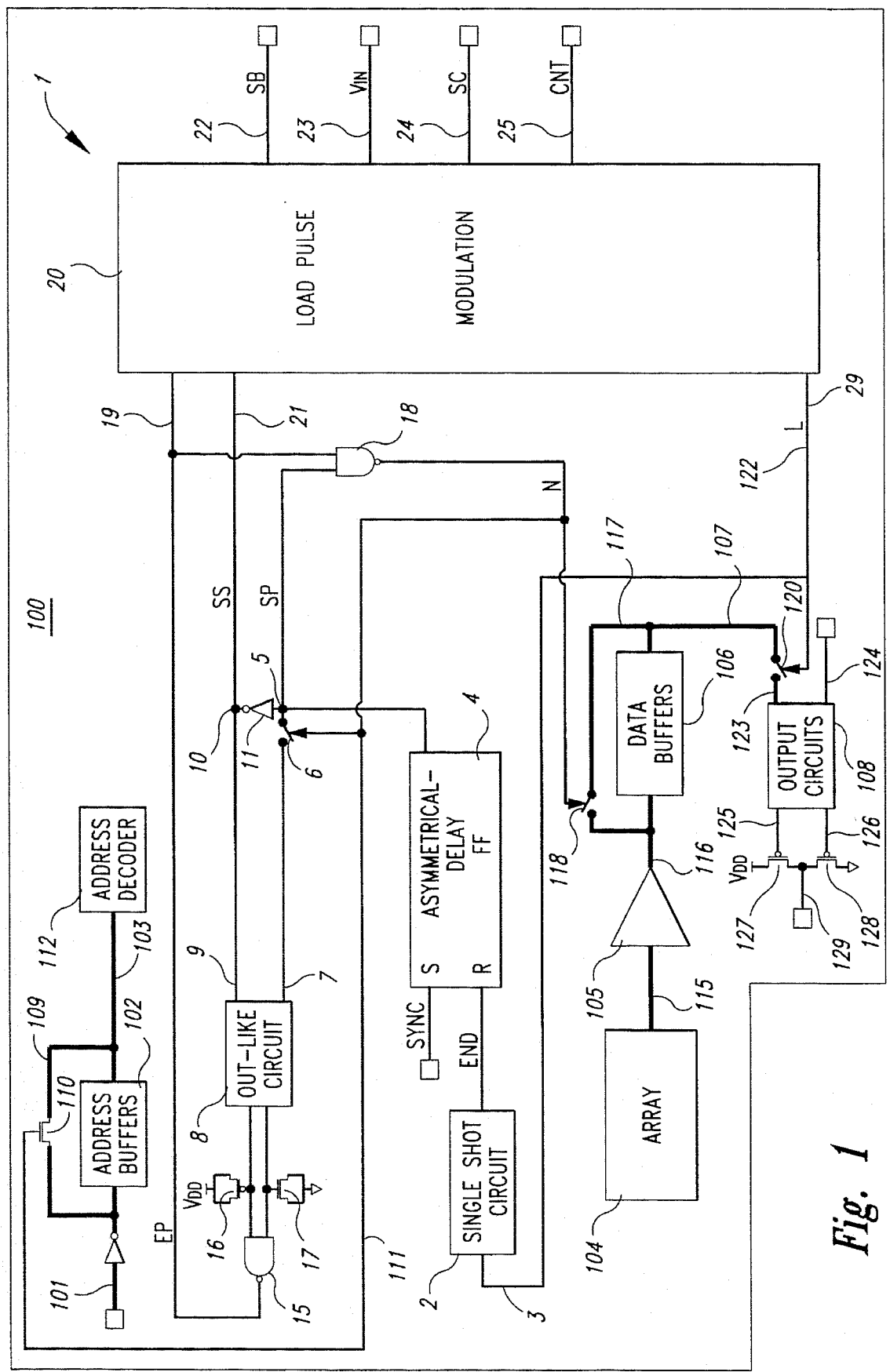
FIG. 1 shows one embodiment of the timing circuit according to the present invention.

FIG. 1 includes a timing circuit 1 forming part of a nonvolatile, flash-type memory 100 shown schematically and of which only a number of parts, timed by circuit 1, are shown. More specifically, memory 100 includes an external address bus 101, an address amplifying unit 102, an internal address bus 103, a memory cell array 104, an amplifying unit 105, a data amplifying unit 106, a data bus 107, and a latch-type output unit 108.

Address amplifying unit 102 is formed from a number of buffers (not shown), and has its input connected to external address bus 101, and its output connected to internal address bus 103. Unit 102 is feedback controlled by an address feedback bus 109 formed by a number of lines along which are provided switches controlled by a single control signal and of which only one is shown in the form of an N-channel transistor 110, which has its gate terminal connected to a line 111 supplying signal N. Feedback by line 109 prevents the address data stored in the buffers of unit 102 from switching in the event of noise on output bus 103 or switching on bus 101, by "freezing" it to the previous value. Internal address bus 103 is connected to an address decoding section 112.

Array 104 and amplifying unit 105 are connected by a bus 115. Unit 105 (formed by a number of sense amplifiers not shown) and data amplifying unit 106 are connected by a bus 116. Amplifying unit 106 (formed by a number of data buffers not shown) is feedback controlled by a data feedback bus 117, which is formed by a number of lines along which are provided switches controlled by a single control signal and only one of which, switch 118, is shown. The control inputs of switch 118 and the other switches are connected to line 111. As in the case of line 109, feedback line 117 provides for maintaining the data stored in the output buffers of unit 106 as long as switches 118 are closed, and regardless of any noise generated on data bus 107 by switching of output unit 108, by virtue of the buffer outputs of unit 106 presenting a much greater impedance with respect to the sense amplifier outputs of unit 105.

Data bus 107, also formed by a number of lines, presents a number of switches controlled by a single signal and of which only one, 120, is shown. The control terminal of switch 120 is connected to a line 122 supplying load signal L, so as to normally interrupt data bus 107 except for the time necessary for loading the data.

Output unit 108 is formed by a number of output circuits, of which only one is shown, each having two inputs 123 and 124. Each input 123 is connected to a respective line of data bus 107 and all inputs 124 are connected to an enabling line supplying a common enabling signal OE. For each output circuit, output unit 108 also presents two outputs 125 and 126 connected to the respective gate terminals of two transistors 127 and 128. P-channel transistor 127 presents its source terminal connected to the supply voltage ($V_{DD}$), and its drain terminal connected to an output node 129, to which is also connected the drain terminal of N-channel transistor 128, which has its source terminal grounded.

Circuit 1 comprises a single-shot (monostable) circuit 2 having an input 3 connected to line 122. Single-shot circuit 2, which is enabled by the trailing edge of signal L, generates at its output a pulse signal END supplied to the reset input R of a synchronizing and asymmetrical delay block 4, which in one aspect of the invention, is formed from an asymmetrical delay flip-flop. Block 4 also presents a second set input S supplied with a synchronizing signal SYNC generated by other sections (not shown) of memory 100 and which enables the data read phase.

Block 4 responds rapidly to each reset request, and with a predetermined delay to each enabling request, for which purpose, on receiving the leading edge of the SYNC pulse, it switches immediately to the reset state, and, on receiving the trailing edge of the same pulse, controls a chain of delay elements. At the end of the delay determined by the delay element chain, the output of block 4 switches to high, and is reset to low on receiving signal END or a second SYNC pulse prior to receiving reset signal END.

The output of block 4 (supplying data simulating signal SP) is connected to a node 5 and, via a controlled switch 6, to one input 7 of an output simulation circuit 8 having a second input 9 connected to node 5 via an inverter 11, the output of which defines a node 10 supplying signal SS. Output simulation circuit 8 presents the same structure as the output circuits constituting unit 108, so as to reproduce exactly or almost exactly the same propagation delay. Like the output circuits of unit 108, circuit 8 presents two outputs. These outputs are connected to the inputs of a NAND gate 15 and to respective transistors 16 and 17. P-channel transistor 16 presents short-circuited drain and source terminals connected to supply voltage $V_{DD}$, and transistor 17 presents short-circuited, grounded drain and source terminals. Both transistors 16 and 17 have a geometry similar to, and thus simulate the capacitance of, transistors 127 and 128, respectively.

The output of NAND gate 15 (supplying signal EP) is connected to one input of an AND gate 18 and to one input 19 of a pulse duration modulating block 20. AND circuit 18 presents a second input connected to node 5, and an output connected to line 111 to which it supplies signal N. Block 20 presents a second input 21 connected to node 10, and inputs 22–25 supplied with signals SB, $V_{IN}$, SC and CNT.

As described in detail in the above cited European patent application entitled "Load signal generating method and circuit for nonvolatile memories", block 20, on the basis of the logic values of signals SB, SC, CNT, and the value of voltage $V_{IN}$ related to the supply voltage, generates signal L at output 29 connected to line 122, which signal L presents a leading edge synchronized perfectly or nearly perfectly with that of signal N, and a duration depending on the condition of the circuit. More specifically, if extension of the load pulse is disabled (CNT logic low), if voltage $V_{IN}$ is at the rated value, if the circuit is not in low-power operating mode (standby state, signal SB logic low), and if static operating mode is not requested (SC logic low), the trailing edge of signal L is simultaneous or substantially simultaneous with that of signal N. Conversely, if extension of the load pulse is enabled (CNT logic high), or at the end of a critical operating condition, the trailing edge of signal L is delayed with respect to that of N, as described below with reference to FIG. 2. If, on the other hand, static operating mode is requested (SC logic high), or the circuit is in standby mode (SB logic high), or voltage $V_{IN}$ is below a predetermined threshold, signal L remains high as long as the system remains in the above state, but switches back to low after a delay with respect to the switching of a respective signal SC, SB, or return of $V_{IN}$ to the acceptable threshold level.

Figure 2:
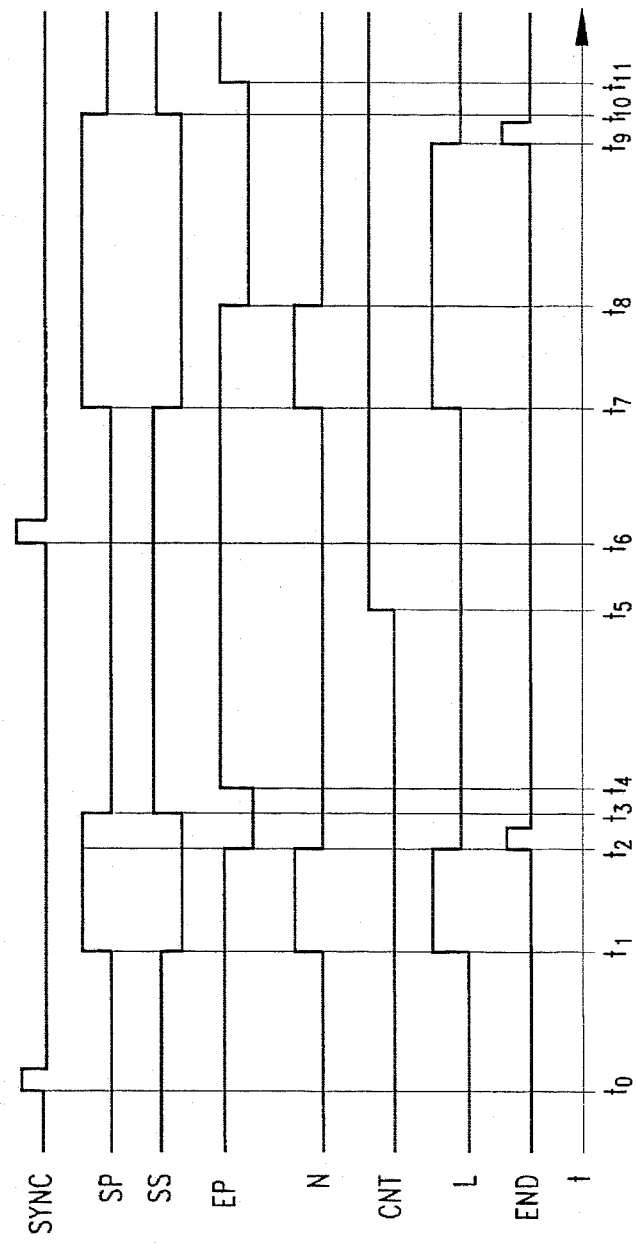
FIG. 2 shows a time plot of various signals in FIG. 1.

Operation of the circuit will now be described with reference to FIG. 2.

Supposing initially that extension of the pulse duration is disabled (CNT logic low). When idle, signals SYNC, SP, N, L, END are low, and signals SS, EP high. At instant $t_0$ memory 100 supplies a SYNC pulse, and with a delay determined by block 4 (which depends on the precharging and evaluation times of array 100), signal SP switches (instant $t_1$) so that AND circuit 18 switches, the output signal N switches to logic high, signal SS switches to logic low, load signal L switches to logic high, and switches 6, 110, 118, and 120 are closed. Closure of switch 6 provides for supplying data simulating signal SP to input 7 of output simulation circuit 8, and closure of switch 118 for freezing and so preventing undesired switching of the output buffers of unit 106. At the same time, transmission commences of the data in the output buffers of unit 106 to the output circuits (unit 108), which thus switch. Since, as already stated, output buffers 106 are prevented from switching at this phase, the noise generated by such switching (which involves high currents due to charging and discharging of the capacitive elements of the output circuits, and may thus also alter the voltage levels in amplifiers 105) is prevented from destroying the data stored in unit 106. Similarly, the addresses amplified in unit 102 are also frozen to prevent switching of the addressed memory locations during reading.

Signal SP thus propagates through output simulation circuit 8 in the same way and simultaneously or substantially simultaneously with the data propagating through output circuits 108. At the end of propagation, the outputs of output simulation circuit 8 switch to high, thus switching NAND circuit 15 (instant $t_2$). Signal EP switches to low, thus switching AND circuit 18 such that signal N switches back to low, thus opening switches 6, 110 and 118. Switching of signal EP is detected by block 20, which, as the pulse duration extension function is disabled, switches load signal L to logic low, thus also opening switch 120 and terminating the data loading phase, which therefore lasts precisely or nearly precisely as long as necessary for propagation of the data through output circuit 108. Output circuits 108 then remain in this loaded state, with no change in the stored data and with no effect from any noise.

On receiving the trailing edge of signal L, single-shot circuit 2 generates at the output a pulse (END signal) for resetting block 4. With a given delay, at instant $t_3$ signal SP switches back to low, thus switching signal SS to high and resetting output simulation circuit 8, which, after a given delay, switches its outputs to low, thus switching circuit 15, so that signal EP switches to high to restore the initial conditions (instant $t_4$).

If, on the other hand, a SYNC signal pulse is received before the initial state is restored (instant $t_4$), block 4 switches immediately to the reset state and starts a further read phase, thus ensuring that each SYNC signal pulse starts a read cycle with a constant delay.

Operation as described above is repeated whenever a SYNC pulse is received, and as long as signal CNT is low, and no static, standby or low-power operating conditions are present.

If, on the other hand, extension of the load signal is enabled, data loading into output circuit unit 108 continues even after the end of the signal N pulse, as described below.

Assuming signal CNT switches to high at instant $t_5$. On receiving the SYNC pulse (instant $t_6$), signal SP switches to high after a given delay (instant $t_7$), SS switches to logic low, signals N and L switch to logic high, and switches 6, 110, 118 and 120 are closed. Transmission of the data simulating signal SP commences through output simulation circuit 8, and the data through output unit 108. At the same time, the data in address buffers 102 and output buffers 106 is maintained by the feedback loops to render it immune to noise.

Figure 3:
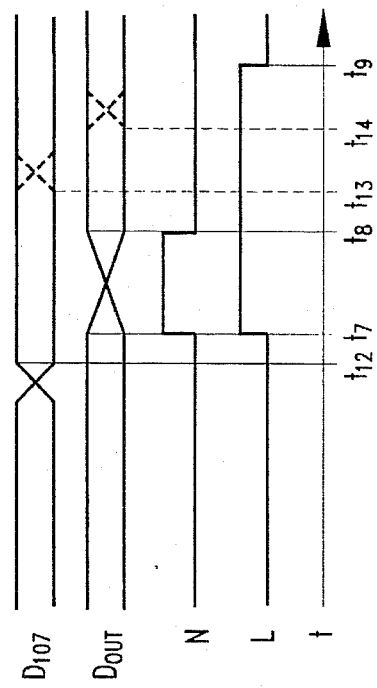
FIG. 3 shows a time plot of various signals in FIG. 1 versus data switching.

As previously, when the outputs of circuit 8 and NAND gate 15 switch, signal EP switches to logic low (instant 18), the signal N pulse is terminated (switches to logic low), and switches 6, 110 and 118 open. In this case, however, load signal L remains high and switch 120 closed, so that any delayed data supplied by sense amplifiers 105 switching after most of the other sense amplifiers may be loaded by the output buffers of unit 106 into corresponding output circuits of unit 108, as explained with reference also to FIG. 3, which shows plots of the data on bus 107 ($D_{107}$) and at the outputs of output unit 108 ($D_{OUT}$). As shown by the continuous line, most of the data $D_{107}$ on bus 107 switches at the end of the evaluation phase by sense amplifiers 105, which switching will be assumed to be generally terminated at instant $t_{12}$. At instant $t_7$, determined by block 4 on the basis of standard evaluation times, the signal N and L pulses commence substantially simultaneously with data loading into output unit 108, the outputs of which begin switching (data $D_{OUT}$). As already stated, switching of a large number of circuits involves high currents which could possibly alter the data stored in buffers 106, but which is prevented from doing so by freezing the data in buffers 106. Pulse N is terminated upon complete switching of the outputs of output circuit 108 (corresponding to complete switching of the outputs of output simulation circuit 8). Should further amplifiers 105 switch in the meantime or successively, this may now be propagated to the output buffers as shown by the dotted line at instant $t_{13}$ in FIG. 3. In view of the small amount of current involved, no altering or destruction of the data is caused by subsequent switching of the respective output circuits 108 (instant $t_{14}$).

At instant $t_9$, signal L also switches to low, thus opening switches 120 and separating the output circuits from buffer unit 106. As in the previous case described above, the trailing edge of signal L enables single-shot circuit 2, which generates an END signal pulse to reset block 4. After a given time (instant $t_{10}$), SP and SS switch to also reset output simulation circuit 8; and, at instant $t_{11}$, signal EP also switches to logic high to restore circuit 1 to the idle condition.

The advantages of the circuit described are as follows. Firstly, it provides for timing which is both flexible and immune to noise, acting on the most significant points which are brought to a block condition when present data may be damaged by switching of the output circuits, while at the same time maintaining the loading phase as long as necessary for also loading the data of the slower elements. Moreover, connection of output unit 108 and amplifying unit 106 is interrupted at the end of the loading phase, to prevent any noise on the lines affecting the data.

The signal for freezing the data (and address) buffers is synchronized substantially perfectly with the load signal to ensure the data is frozen at substantially the exact time it is loaded. Moreover, the load signal (which, via synchronizing circuit 4, is only enabled when the data of most of the sense amplifiers of unit 105 has been read) presents a duration which, the characteristics of the memory permitting, is the minimum for ensuring switching of the outputs, thanks to output simulation circuit 8, and is only extended when necessary (e.g. on exiting critical situations, in which case the memory undoubtedly presents delays in reaching steady-state values, or in the presence of slow elements).

Figure 4:
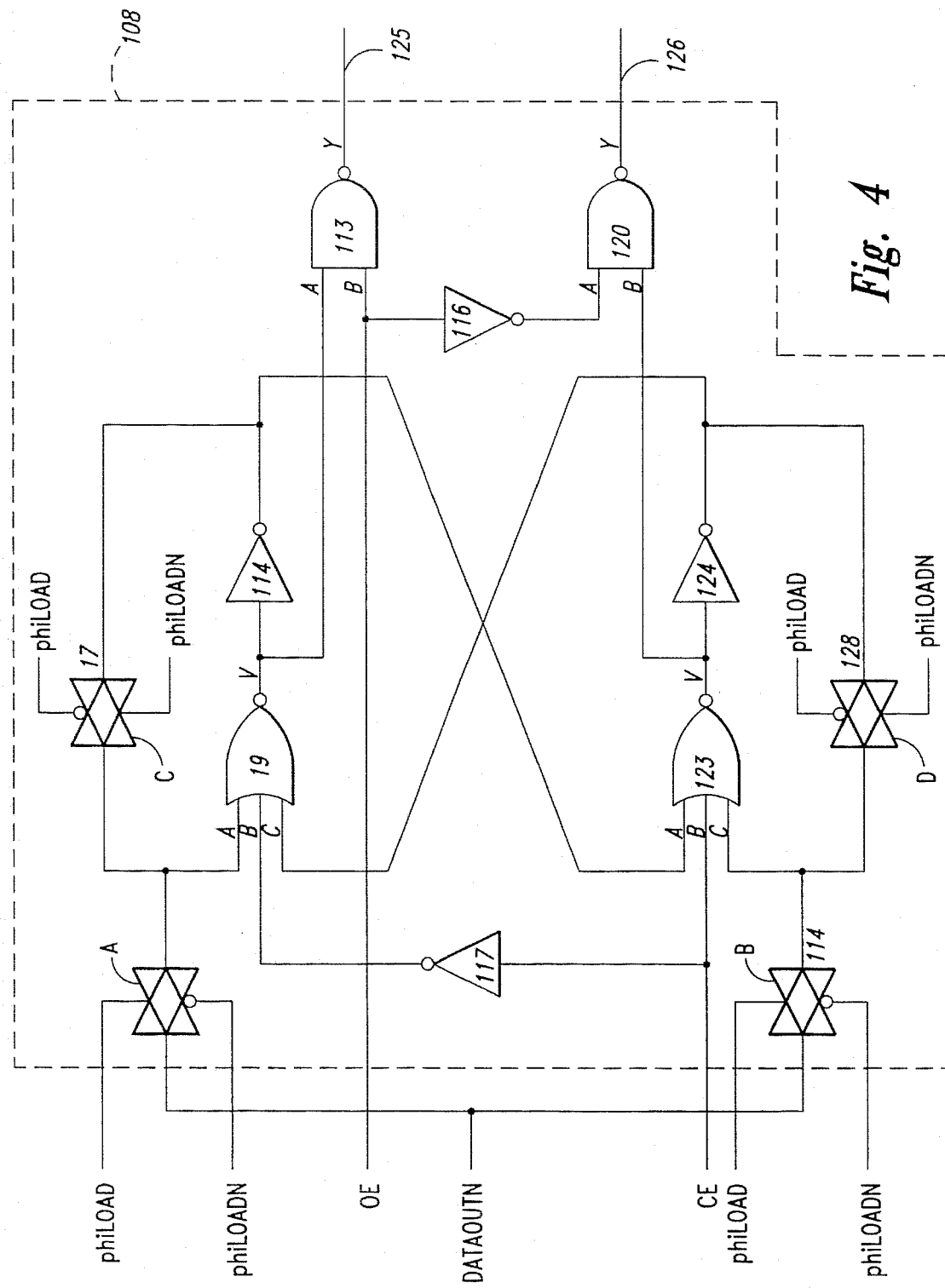
FIG. 4 is a schematic diagram of an embodiment of an output circuit of FIG. 1.

FIG. 4 is a circuit diagram of one embodiment of an output circuit 108 of FIG. 1. In operation, gates I9 and I23, which form a latch circuit, are fed with signal DATAOUTN when switches A and B are closed, i.e., when signal phiLOAD is logic high, and signal phiLOADN is logic low. Switches C and D are open during the period when switches A and B are closed, Next, when signals phiLOAD and phiLOADN switch, i.e., phiLOAD becomes low and phiLOADN becomes logic high, the data input to gates I9 and I23 is transferred to output gates I13 and I20. Also, switches A and B open and switches C and D close. Enable signal OE enables the data transferred to gates I13 and I20 to be transferred to lines 125 and 126 and thus to transistors 127 and 128 and output pad 129 as discussed above in conjunction with FIG. 1. Signal OE and another enable signal CE are generated in other parts of circuit 100 in order to disable the output circuits 108 when the outputting of data is not required. Signal phiLOAD is generated internally within circuit 100 to synchronize output circuits 108 to the other circuits within circuit 100. Signal phiLOADN is obtained by inverting signal phiLOAD.

Figure 5:
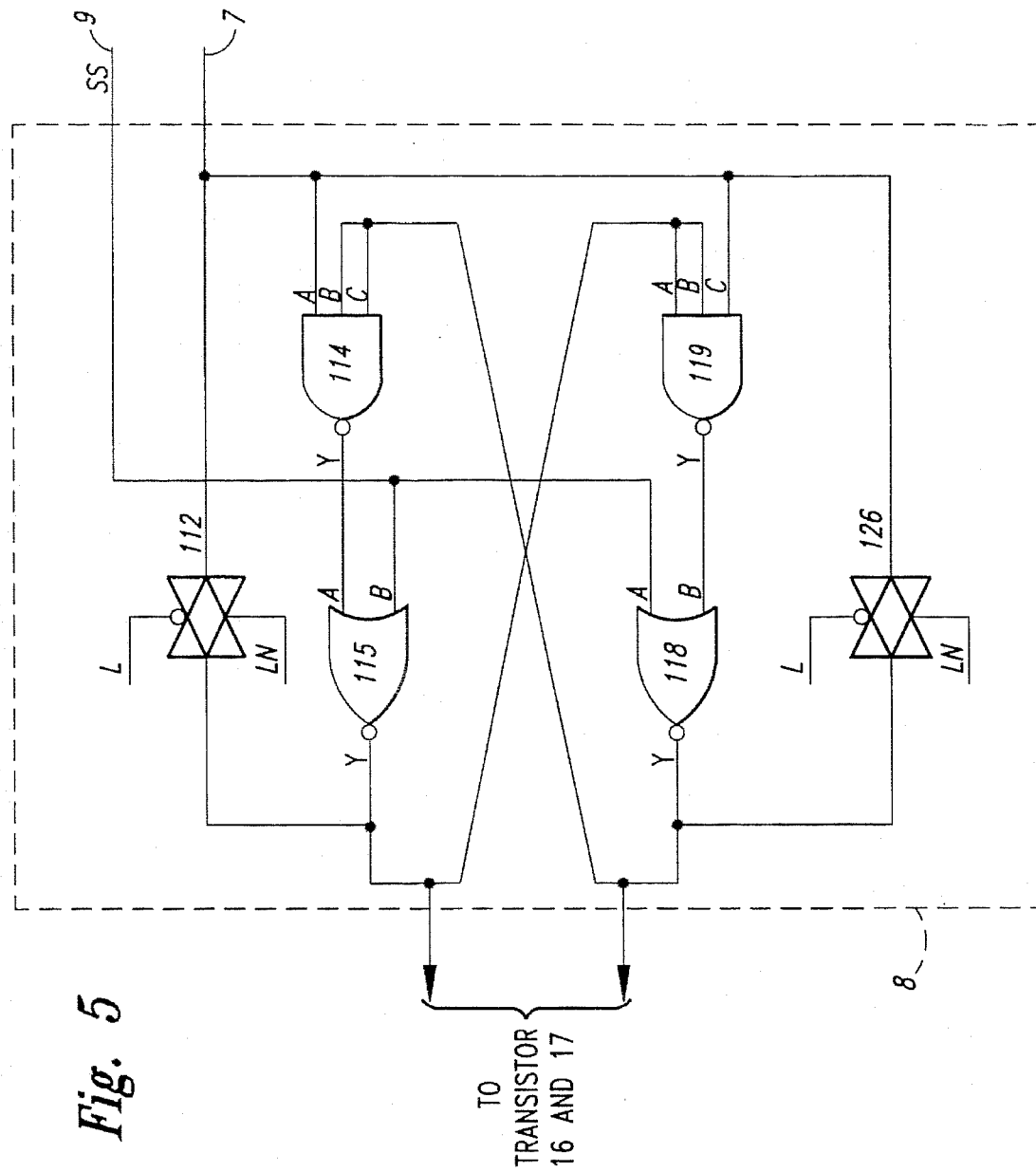
FIG. 5 is a schematic diagram of an embodiment of the output simulation circuit of FIG. 1.

FIG. 5 is a circuit diagram of output simulation circuit 8 of FIG. 1 according to one aspect of the present invention. Output simulation circuit 8 is constructed to provide the same or substantially the same delay as output circuit 108 of FIG. 1. In all aspects other than propagation delay, it is not necessary that output simulation circuit 8 be equivalent to output circuit 108. Typically, however, simulation circuit 8 includes the same number of gates having similar delay characteristics as in output circuit 108, along the signal propagation line (which is between DATAOUTN and outputs 125 and 126 of output circuit 108, and between input 7 and the outputs of output simulation circuit 8). In one aspect of the invention, the delays along the signal propagation lines for output circuit 108 and output simulation circuit 8 are both approximately 5 nanoseconds.

Figure 6:
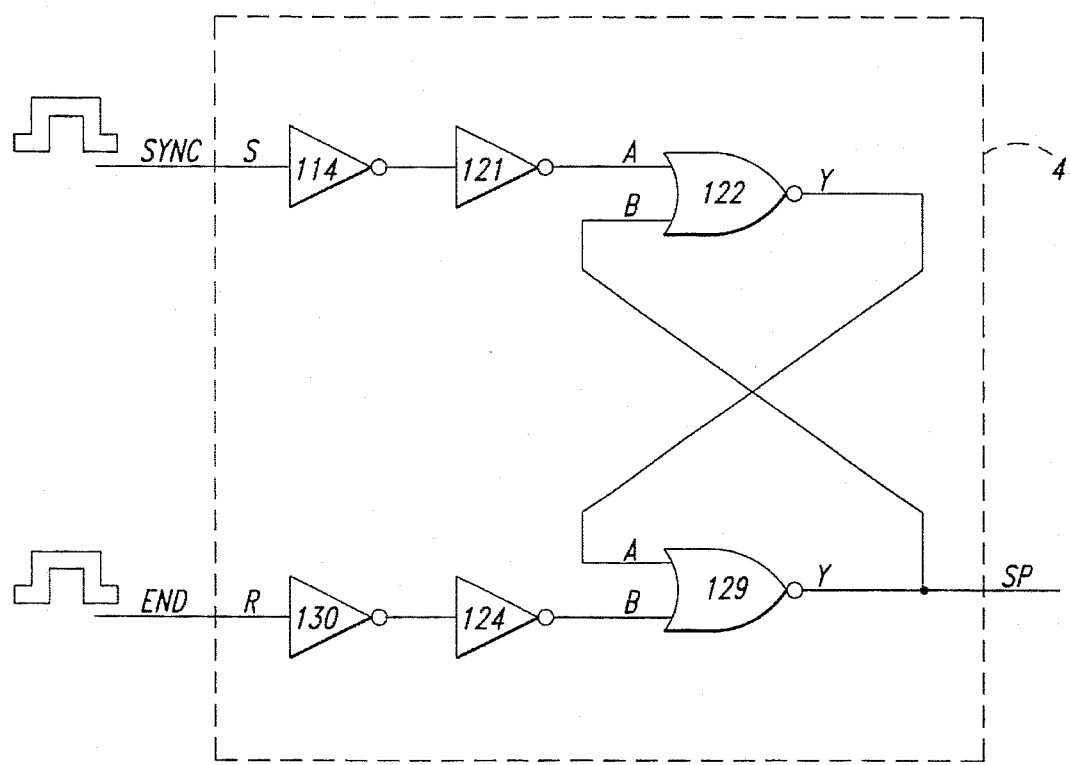
FIG. 6 is a schematic diagram of an embodiment of the asymmetrical delay flip-flop of FIG. 1.

FIG. 6 is a circuit diagram of a delay flip-flop 4 of FIG. 1 according to one aspect of the invention. Flip-flop 4 includes at both its S and R inputs two serially coupled inverters that delay the input signals SYNC and END, respectively. In operation, when both inputs are at a logic low, the output of gate I22 is logic high and the output of gate I29, which is signal SP, is logic low. When SYNC switches to logic high, with a delay given by the time required for the leading edge of SYNC to propagate through four gates (i.e., the two serially coupled inverters at the S input, and gates I22 and I29), SP switches to logic high. Thus, the input B of gate I22 switches to a logic high, and the switching of SYNC back to logic low does not change the state of circuit 34. Signal END causes reset of the circuit 4, with signal SP switching back to logic low after a delay caused by the time required for the leading edge of END to propagate through three gates (the two serially coupled inverters at the R input and gate I29). In one aspect of the invention, the pulse widths for signals END and SYNC are approximately in the range of between 5 and 7 nanoseconds. Also, in another aspect of the invention, the set and reset delays of flip-flop 4 are both in the range of approximately 5 to 7 nanoseconds.

Figure 7:
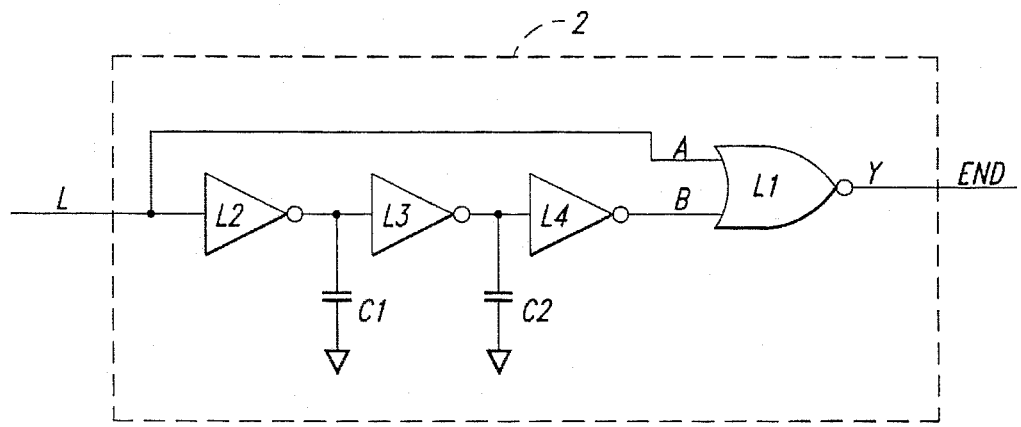
FIG. 7 is a schematic diagram of an embodiment of the single-shot circuit of FIG. 1.

FIG. 7 shows a circuit diagram of a single-shot circuit 2 of FIG. 1 according to one aspect of the invention. Single-shot circuit 2 includes three inverters and two capacitors arranged so as to form a delay line such that one input of NOR gate I1 switches later than the other input. For example, an initial condition may be when signal L is low, input B is logic high, and output signal END is logic low. When signal L switches to logic high, both inputs A and B are logic high, and signal END remains logic low. END also remains logic low even when input B switches to a logic low. When signal L switches to a logic low, both inputs A and B are then logic low, so END switches to a logic high and remains at a logic high until the falling edge of signal L has propagated along the delay line formed by the inverters and capacitors. Then, input B becomes logic high, and signal END transitions to a logic low.

Clearly, changes may be made to the circuit and method as described and illustrated herein without, however, departing from the scope of the present invention.

We claim:

1. A method of suppressing the data loading noise of nonvolatile memories, comprising the step of enabling a data loading signal for loading data from a data amplifying unit to an output element; characterized in that it comprises the steps of:

enabling a noise suppressing signal simultaneously with said step of generating a data loading signal; and blocking switching of said data amplifying unit for a suppression time substantially equal to the switching delay of said output element.

2. A method as claimed in claim 1, characterized in that it comprises the step of enabling address loading from an address amplifying unit to an address processing unit, and simultaneously blocking switching of said address amplifying unit for said suppression time.

3. A method as claimed in claim 1, characterized in that it comprises the step of disabling said noise suppressing signal, for unblocking switching of said data amplifying unit at the end of said suppression time, and maintaining said loading signal enabled.

4. A method as claimed in claim 3, characterized in that it comprises the steps of generating a data simulating signal; enabling loading of said data simulating signal into an output simulation circuit, identical to said output element, simultaneously with said step of enabling data loading into said output element; and unblocking switching of said data amplifying unit following propagation of said data simulating signal in said output simulation circuit.

5. In a nonvolatile memory comprising a data amplifying unit and an output element mutually connected by a connection line, a data loading noise suppressing circuit comprising enabling means for generating an enabling signal; loading generator means having an enabling input connected to said enabling means, and generating a loading signal; and output enabling means for enabling data loading from said data amplifying unit to said output element on detecting said loading signal; characterized in that it comprises noise suppressing means including suppressing signal generator means having an enabling input connected to said enabling means and generating a noise suppressing signal enabled simultaneously with said loading signal; data blocking means controlled by said noise suppressing signal and connected to said data amplifying unit for preventing switching of said data amplifying unit in the presence of said noise suppressing signal; and disabling means for generating a disabling signal for said suppressing signal generator means at the end of the switching delay of said output element.

6. A circuit as claimed in claim 5, in a nonvolatile memory also comprising an address amplifying unit and an address processing unit connected by an address line; characterized in that it also comprises address blocking means connected to said address amplifying unit, for preventing switching of said address amplifying unit in the presence of said noise suppressing signal.

7. A circuit as claimed in claim 5, characterized in that said enabling means comprise simulating signal generator means for generating a data simulating signal; and said disabling means comprise an output simulation circuit identical to said output element and having an input connected to said simulating signal generator means via switching means controlled by said noise suppressing signal.

8. A circuit as claimed in claim 7, characterized in that said loading generator means comprise loading extension means having a first input connected to said simulating signal generator means; a second input connected to said disabling means; a third input supplied with an extension control signal; and an output connected to said output enabling means; said loading signal being enabled simultaneously with said noise suppressing signal, and presenting the same duration as said noise suppressing signal in the absence of said extension control signal, and a longer duration in the presence of said extension control signal.

9. A circuit as claimed in claim 8, characterized in that said output of said loading extension means is connected to the reset input of said simulating signal generator means, for resetting the control circuit upon disabling of said loading signal.

10. A circuit as claimed in claim 8, characterized in that said output enabling means comprise a controlled switch located along a data line connecting said data amplifying unit and said output element, and having a control input connected to said output of said loading extension means.

11. A circuit as claimed in claim 5, characterized in that said data blocking means comprise a feedback line connecting the input and output of said data amplifying unit; and controlled switch means located along said feedback line and having a control input supplied with said noise suppressing signal.

12. A circuit as claimed in claim 7, characterized in that said simulating signal generator means comprise an asymmetrical-delay memory element for generating said data simulating signal with a predetermined delay following reception of an external control signal, and which switches rapidly to the reset condition.

* * * * *